United States Patent
Wang

(10) Patent No.: US 7,759,252 B2
(45) Date of Patent: Jul. 20, 2010

(54) METHOD OF TWO-STEP BACKSIDE ETCHING

(75) Inventor: Yeng-Peng Wang, Fongshan (TW)

(73) Assignee: Promos Technologies Inc., Hsinchu (TW)

( * ) Notice: Subject to any disclaimer, the term of this patent is extended or adjusted under 35 U.S.C. 154(b) by 571 days.

(21) Appl. No.: 11/822,754

(22) Filed: Jul. 10, 2007

(65) Prior Publication Data
US 2008/0280450 A1 Nov. 13, 2008

(30) Foreign Application Priority Data
May 9, 2007 (TW) .............................. 96116527 A

(51) Int. Cl.
*H01L 21/302* (2006.01)
(52) U.S. Cl. .................... 438/704; 438/717; 438/719; 438/748; 438/753; 216/91; 216/92; 216/99
(58) Field of Classification Search ................ 438/704, 438/717, 719, 748, 753; 216/91, 92, 99
See application file for complete search history.

(56) References Cited

U.S. PATENT DOCUMENTS

| | | | | |
|---|---|---|---|---|
| 5,426,073 | A * | 6/1995 | Imaoka et al. | 438/597 |
| 6,395,646 | B1 * | 5/2002 | Liu | 438/747 |
| 6,482,749 | B1 * | 11/2002 | Billington et al. | 438/745 |
| 6,562,692 | B1 * | 5/2003 | Oi | 438/406 |
| 6,861,359 | B2 * | 3/2005 | Ota et al. | 438/692 |
| 6,924,236 | B2 * | 8/2005 | Yano et al. | 438/692 |
| 2007/0000873 | A1 * | 1/2007 | Kubota et al. | 216/88 |
| 2007/0042600 | A1 * | 2/2007 | Takeoka | 438/638 |
| 2008/0003830 | A1 * | 1/2008 | Qing et al. | 438/694 |

* cited by examiner

*Primary Examiner*—Binh X Tran
(74) *Attorney, Agent, or Firm*—Rosen, Klein & Lee

(57) ABSTRACT

The present invention is related to a method of two-step backside-etching. First, a substrate with a plurality of hard masks is provided. Next, the back and the edge of the substrate are backside-etched to remove parts of the hard masks on the back and the edge of the substrate. Then, the hard masks and the substrate are patterned in sequence to form a plurality of trenches in the substrate. Finally, before performing a wet bath step, the edge of the substrate is backside-etched to remove needle structures on the edge of the substrate.

8 Claims, 3 Drawing Sheets

METHOD OF TWO-STEP BACKSIDE ETCHING

RELATED APPLICATIONS

This application claims priority to Taiwan Application Serial Number 96116527, filed May 9, 2007, which is herein incorporated by reference.

BACKGROUND

1. Field of Invention

The present invention relates to a method for manufacturing a semiconductor device. More particularly, the present invention relates to a method for manufacturing a dynamic random access memory having deep trench capacitors.

2. Description of Related Art

Dynamic random access memory (DRAM) is a semiconductor memory. It consists of transistors and capacitors wherein capacitors are used to store charges and one of the capacitors usually used for DRAM is called a trench capacitor.

The so-called trench capacitor is a type of capacitor arranged in the substrate. In the process of manufacturing trench capacitors, a substrate is dry trenched by plasma first to form trenches in the substrate, and then the capacitors are arranged in the trenches. In order to increase the capacity of trench capacitors, the trenches in the substrate are usually deep. These are called deep trench capacitors. However, in the process of manufacturing deep trench capacitors, sometimes defects are found in the deep trench structures. This causes the deep trench capacitor to lose the function of storing charges which will affect the quality of the semiconductor devices.

For the forgoing reasons, it is an important issue to eliminate defect sources in the process of manufacturing trench capacitors to reduce defects and to improve the quality of products.

SUMMARY

The present invention is directed to a method of two-step backside-etching to decrease defects in a manufacturing process of deep trench capacitor.

It is therefore an objective of the present invention to provide a method of two-step backside etching. First, a substrate is provided wherein the substrate has a plurality of hard masks. Next, the back and the edge of the substrate are first backside-etched to remove a part of the hard masks on the back and the edge of the substrate. After that, the hard masks and the substrate are patterned in sequence to form a plurality of trenches in the substrate. Finally, the edge of the substrate is second backside-etched to remove a plurality of needle structures on the edge of the substrate before performing a wet bath step.

In accordance with the foregoing and other objectives of the present invention, to prevent a valid chipping area at the center of the substrate from being damaged, the step of first backside-etching and the step of second backside-etching are performed at a null chipping area to form a first treating area and a second treating area respectively wherein the second treating area is at least as large as the first treating area.

In conclusion, the invention not only decreases defects but also improves yield by first backside-etching and second backside-etching. Moreover, since a part of the hard masks can be removed before trenching the substrate, a process window of plasma can be increased without causing chipping defects. Hence, trenches of deep trench capacitors can be formed more deeply and completely, and the storage efficiency can be increased as well.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
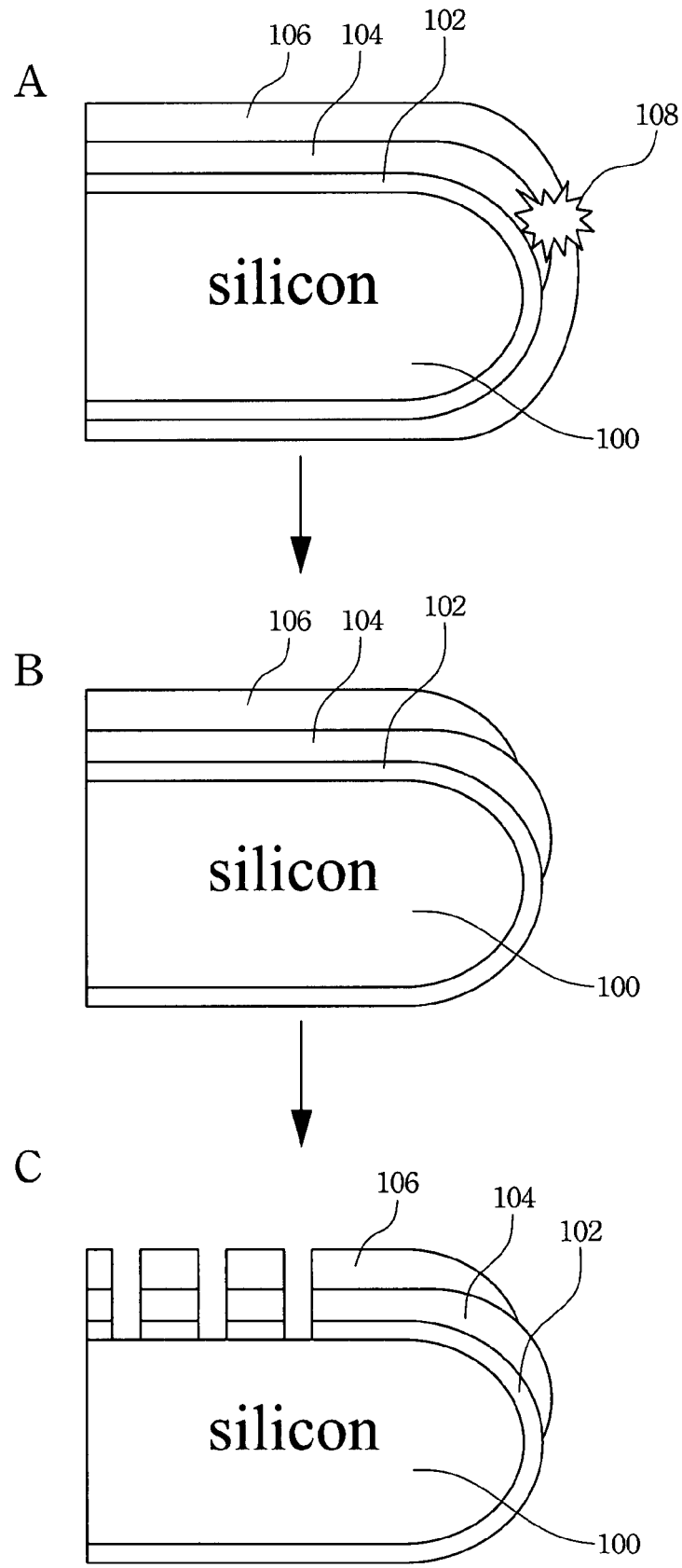
FIGS. 1A-1C are cross section views of a manufacturing process of deep trench capacitor according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Finding Defect Sources

In order to reduce the numbers of detects, it is necessary to find defect sources in the manufacturing process. Therefore, each step of the manufacturing process was monitored and the number of defects was counted.

The steps of the manufacturing monitored included: several hard masks formed on a silicon substrate. In a manufacturing process of deep trench capacitors, the hard masks are used to replace a photoresist for patterning the silicon substrate. Since conventional photoresists cannot stand plasma etching for a long time to form deep trenches in the substrate, hard masks need to be formed on the substrate to resist plasma etching. Next, these hard masks were patterned in sequence. Finally, the silicon substrate was trenched by utilizing the hard masks patterned to form deep trenches. Meanwhile, the number of defects formed at each step above was also monitored by detecting the intensity of scattering light of the silicon substrate with inclined infrared ray.

According to the monitoring result, there is no big difference in the defect numbers before the step of patterning the hard masks and after the step of trenching the substrate, even though some defects were detected. However, after the step of trenching the substrate, defect numbers increased dramatically, and most of defects were located near the edge of the substrate.

On the basis of foregoing evidence, it inferred that at the beginning, a small amount of defects happened due to stripping, scratching, or impacting the hard masks on the edge of the silicon substrate. This was because robots usually grab on to the edge of the substrate during transportation. While trenching the substrate, these small defects attracted plasma, and plasma aggregated on the edge of the substrate, which produced a lot of by-products when trenching the substrate.

After that, these by-products further accumulated on the edge of the substrate and hindered etching. Therefore, the defect numbers on the edge of the silicon substrate increased. This phenomenon is called chipping defect.

In addition to chipping defect, it is also found that after trenching the substrate, some needles were formed on the edge of the substrate. After the wet bath process, the needles were broken and spread on the edge and center of the substrate which might damage valid chips. The wet bath process mentioned above is a process to remove impurities produced during the etching step by sonication.

The reason for needle defects is that the area of the silicon substrate is too large and the edge of the substrate is curving, so the hard masks formed on the edge were thinner or incomplete. Therefore, the edge of the substrate cannot be protected by hard masks while trenching which results in some needle structures forming on the substrate. The needle structures were broken during the wet bath and were spread on the edge and the center of the silicon substrate which causes some defects. These defects are called needle defects.

Accordingly, a method of preventing chipping defects and needle defects is provided to improve yields.

A Method for Preventing Chipping Defects

FIGS. 1A-1C illustrate cross section views of a manufacturing process of deep trench capacitor according to one embodiment of the present invention. In the embodiment of the present invention, it emphasizes how to prevent defects at the trenching step. Therefore, in the following embodiment, the steps of forming hard masks were described at the beginning and the process of the deep trench capacitor previously stated is not described herein.

First, according to FIG. 1A, silicon nitride layer 102, borosilicate glass (BSG) layer 104 and polysilicon layer 106 were formed on a substrate 100 as hard masks for trenching. With regard to choosing materials used for hard masks, it must consider both the thickness of the hard masks and etching selectivity must be considered in case the hard masks formed are too thick to be etched completely or too thin for deep trenching. In the embodiment of the present invention, polysilicon layer 106 and silicon nitride layer 102 were formed by chemical vapor deposition (CVD) in a furnace room, so both were formed on the back of the substrate 100. The borosilicate glass layer 104 was formed by plasma enhanced chemical vapor deposition, so it only covered the edge of the substrate 100. However, in practice, the material used for hard masks and the condition of hard masks formed on the substrate vary with different methods used for forming hard masks and practical needs. These are known by those skilled in the art so are not described herein. Additionally, in FIG. 1A, a defect 108 in the polysilicon layer 106 was exemplified to show the source and position of chipping defect. The defect 108 might be in borosilicate glass layer 104 or silicon nitride layer 102 as well.

Next, in FIG. 1B, first backside-etching was performed to remove part of polysilicon layer 106 on the back and the edge of the substrate 100. By removing part of polysilicon layer 106 on the edge of the substrate 100, the defect 108 can be removed, too.

Finally, in FIG. 1C, the polysilicon layer 106, borosilicate glass layer 104 and silicon nitride layer 102 were patterned in sequence. Since the defect 108 had already been removed at the previous step, the later process, such as trenching the substrate 100 for deep trench capacitors, will not cause chipping defects.

Chipping Defect Numbers Testing

To verify that the first backside-etching can reduce chipping defects, two substrates were or were not first backside-etched respectively. After the step of trenching substrate, these two substrates were examined. According to the testing result, it was found that there were 30 thousands defects on the edge of the substrate not first backside-etched. However, there were only one thousand defects on the edge of the substrate first backside-etched. This shows that chipping defects that happen on the edge of the substrate can be reduced dramatically by first backside-etching. The numbers of defects decreased around 30 times which improves the yield of the products greatly.

A Method for Preventing Needle Defects

As set forth above, the other main defect source is needle defects. Needle defects were caused by needle structures formed on the edge of the substrate and needle structures result from the silicon substrate not completely etched. Additionally, needle defects usually happen after the step of trenching the substrate, and before the wet bath. Therefore, in the embodiment of the present invention, emphasis is on the process following trenching the substrate. The process before the step of trenching and first backside-etching were the same as above.

Figure 2:
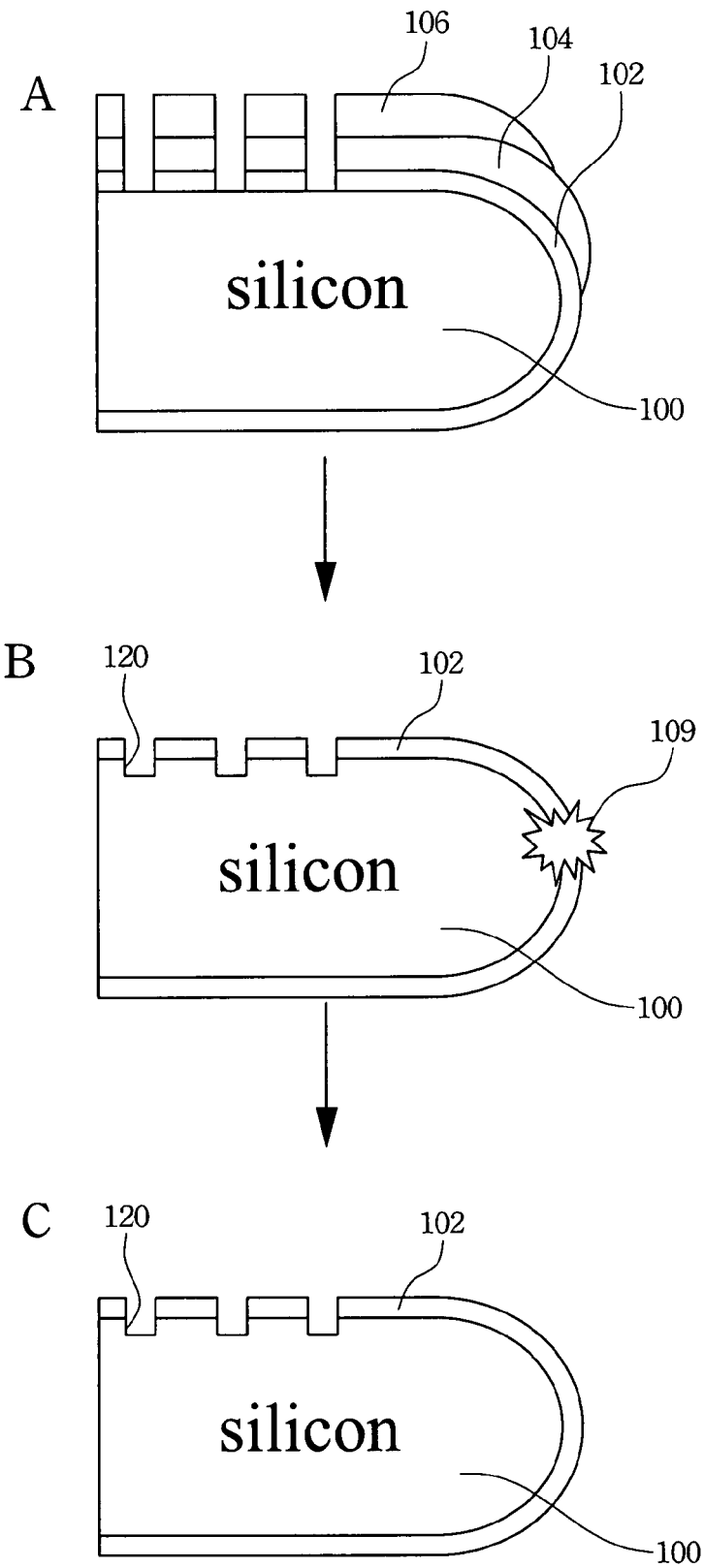
FIGS. 2A-2C are cross section views of a manufacturing process of deep trench capacitor according to one embodiment of the present invention.

FIGS. 2A-2C illustrate cross section views of a manufacturing process of deep trench capacitor according to one embodiment of the present invention. On the basis of above, in FIG. 2A, the substrate 100 had already been first backside-etched. Therefore, a part of polysilicon 206 on the edge of the substrate 100 was removed. Next, the polysilicon layer 106, borosilicate glass layer 104 and the silicon nitride layer 102 were patterned.

In FIG. 2B, the polysilicon layer 106, borosilicate glass layer 104 and the silicon nitride layer 102 patterned were used as hard masks to trench the substrate 100 by plasma. After that, a plurality of trenches 120 were formed in the substrate 100 for arranging deep trench capacitors. Moreover, after the trenches 120 were formed, the polysilicon layer 106, and borosilicate glass layer 104 were removed. It should be known that in FIG. 2B, the defect 109 on the edge of the substrate 100 was exemplified to show the source and position of needle defect.

Next, in FIG. 2C, the edge of the substrate 100 was second backside-etched by etching liquids to remove needle structures on the edge of the substrate 100. Since the needle structures were removed at this step, the later process, such as wet bath, will not cause needle defects.

Needle Defect Numbers Testing

To verify that needle defects were reduced by the second backside-etching, two substrates were or were not second backside-etched respectively. After that, these two substrates were examined after the wet bath process. According to the testing result, it was found that there were one thousand defects on the edge of the substrate not second backside-etched. However, there were only one hundred defects on the edge of the substrate second backside-etched. This shows that needle defects occurring on the edge of the substrate can be reduced dramatically by second backside-etching. It was proved that the number of defects decreased around 10 times and the yield of products is improved greatly.

The Method of Wet Backside-Etching and the Apparatus Thereof

Figure 3:
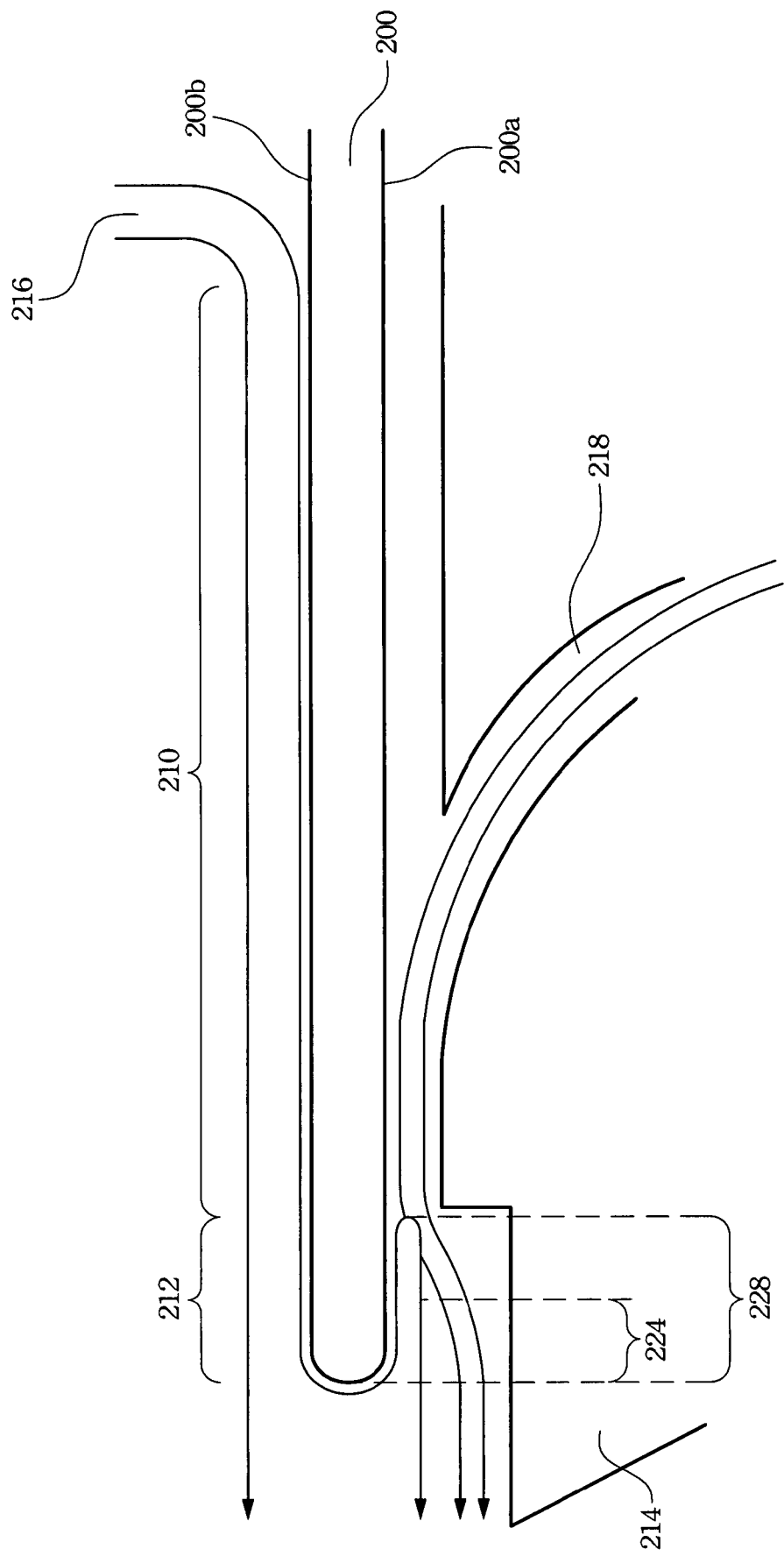
FIG. 3 is a cross section view of the backside-etching apparatus according to one embodiment of the present invention.

To interpret the first backside-etching and the second backside-etching more specifically, FIG. 3 illustrates a cross section view of the backside-etching apparatus. In FIG. 3, a substrate 200 is positioned on the machine 214 wherein the back 200b of the substrate 200 is faceup and the front 200a of the substrate 200 is facedown. Moreover, the substrate 200 comprises a valid chipping area 210 at the center and a null chipping area 212 at the edge of the substrate 200. To perform backside-etching, the etching liquid 216 was piped from the pipe above the machine 214 to the back 220b of the substrate 200 and finally covered the entire back 220b of the substrate 200. After that, the etching liquid 216 flowed along the edge of the substrate 200 and then reached to the front 200a for etching.

In order to prevent the etching liquid 216 from going beyond the null chipping area 212 and damaging the valid chipping area 210 at the center of the substrate 200, a gas 218 is provided below the machine 214. The gas 218 came from the valid chipping area 210 at the center of the front 200a of the substrate 200 to the null chipping area 212 at the edge of the substrate 200 to drive the movement of the etching liquid 216. Hence, valid chipping area 210 can be protected from being damaged by the etching liquid 216. Accordingly, regardless of the first backside-etching or the second backside-etching, only the null chipping area 212 at the edge of the substrate were etched. Moreover, to remove needle structures on the edge of the substrate 200 completely, an area second backside-etched, named second treating area 228, is at least as large as an area first backside-etched, named first treating area 224.

The etching liquid 216 used above can be varied. Taking the embodiment above for example, the etching liquids used for the silicon nitride layer 102, borosilicate glass layer 104, and polysilicon layer 106 can be hydrofluoric acid, (or an aqueous solution of hydrofluoric acid (HF) and ammonia ($NH_3$)), hot phosphoric acid, and an aqueous solution of hydrofluoric acid (HF) and nitric acid (HNO3), respectively.

Moreover, the wet backside-etching above can be cooperated with a dry etching. Again, taking the embodiment above for example, the polysilicon layer 106 on the edge and on the back of the substrate 100 can be removed by wet backside-etching first, and then the silicon nitride layer 102 and borosilicate glass layer 104 on the edge of the substrate 100 can be removed by dry etching.

According to the foregoing embodiment, by backside-etching before and after the step of trenching a substrate, it prevents the substrate from chipping defects and needle defects. Moreover, since the method of backside-etching is only preformed in the null chipping area, the valid chipping area will not be damaged. Therefore, the yield of the products can be improved a lot.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of two-step backside etching, comprising:
   providing a substrate, wherein the substrate has a plurality of hard masks;
   first backside-etching the back and the edge of the substrate to remove a part of the hard masks on the back and the edge of the substrate;
   patterning the hard masks and the substrate in sequence to form a plurality of trenches in the substrate; and
   second backside-etching the edge of the substrate to remove a plurality of needle structures on the edge of the substrate before performing a wet bath step.

2. The method of claim 1, wherein the hard masks are made of a material selected from the group consisting of silicon oxide, polysilicon, silicon nitride, and a combination thereof.

3. The method of claim 1, wherein the step of first backside-etching is performed by wet backside-etching when a part of the hard masks are made of polysilicon.

4. The method of claim 1, wherein the step of first backside-etching is performed dry etching when a part of the hard masks is made of silicon nitride or silicon oxide.

5. The method of claim 1, wherein the step of first backside-etching and the step of second backside-etching are performed at a null chipping area to form a first treating area and a second treating area respectively, and the second treating area is as large as the first treating area.

6. The method of claim 1, wherein the step of first backside-etching and the step of second backside-etching are performed at a null chipping area to form a first treating area and a second treating area respectively, and the second treating area is larger than the first treating area.

7. The method of claim 1, wherein the step of first backside-etching and the step of second backside-etching are performed by wet backside-etching and dry etching respectively.

8. The method of claim 7, wherein the dry etching is performed by plasma etching.

* * * * *